United States Patent
Abadeer et al.

(10) Patent No.: US 7,548,080 B2
(45) Date of Patent: Jun. 16, 2009

(54) METHOD AND APPARATUS FOR BURN-IN OPTIMIZATION

(75) Inventors: Wagdi W. Abadeer, Jericho, VT (US); Harold Pilo, Underhill, VT (US); Daryl M. Seitzer, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/538,833

(22) Filed: Oct. 5, 2006

(65) Prior Publication Data

US 2007/0085557 A1 Apr. 19, 2007

Related U.S. Application Data

(62) Division of application No. 10/908,620, filed on May 19, 2005, now Pat. No. 7,141,998.

(51) Int. Cl.
G01R 31/02 (2006.01)
(52) U.S. Cl. ..................................... 324/760
(58) Field of Classification Search .............. 324/760, 324/763, 765
See application file for complete search history.

(56) References Cited

U.S. PATENT DOCUMENTS

| | | | | |
|---|---|---|---|---|
| 5,406,212 | A * | 4/1995 | Hashinaga et al. | 324/760 |
| 5,844,429 | A * | 12/1998 | Cho | 327/68 |
| 5,982,189 | A * | 11/1999 | Motika et al. | 324/763 |
| 6,023,186 | A | 2/2000 | Kuroda | |
| 6,037,792 | A * | 3/2000 | McClure | 324/760 |
| 6,078,084 | A | 6/2000 | Nakamura et al. | |
| 6,215,324 | B1 | 4/2001 | Yoshida | |
| 6,326,800 | B1 * | 12/2001 | Kirihata | 324/760 |
| 6,377,897 | B1 | 4/2002 | Boyington et al. | |
| 6,407,567 | B1 | 6/2002 | Etter | |
| 6,453,258 | B1 | 9/2002 | Aoki et al. | |
| 6,476,627 | B1 | 11/2002 | Pelissier et al. | |
| 6,489,793 | B2 | 12/2002 | Jones et al. | |
| 6,593,799 | B2 | 7/2003 | De et al. | |

(Continued)

FOREIGN PATENT DOCUMENTS

JP 05075061 A 3/1993

OTHER PUBLICATIONS

"Appendix E: Understanding Integrated Circuit Package Power Capabilities", Apr. 2000, National Semiconductor Corporation, pp. 1-7.

(Continued)

*Primary Examiner*—Ha Tran T Nguyen
*Assistant Examiner*—Arleen M Vazquez
(74) *Attorney, Agent, or Firm*—Michael LeStrange; Hoffman Warnick LLC (57) ABSTRACT

The present invention provides a method and apparatus for optimizing the burn-in of integrated circuits. One embodiment of the method comprises: performing a first portion of the burn-in process of the integrated circuit; monitoring a power dissipation of the integrated circuit during the first portion of the burn-in process; increasing a burn-in temperature until the power dissipation of the integrated circuit reaches a predetermined maximum power dissipation; and performing a subsequent portion of the burn-in process of the integrated circuit at the increased burn-in temperature.

2 Claims, 7 Drawing Sheets

U.S. PATENT DOCUMENTS

| | | |
|---|---|---|
| 6,630,838 B1 | 10/2003 | Wong |
| 6,630,857 B2 | 10/2003 | Mizuno et al. |
| 6,683,467 B1 | 1/2004 | Keshavarzi et al. |
| 6,727,723 B2 * | 4/2004 | Shimizu et al. ............. 324/765 |
| 6,747,471 B1 * | 6/2004 | Chen et al. .................. 324/765 |
| 6,900,650 B1 * | 5/2005 | Sheng et al. ................ 324/760 |
| 6,901,303 B2 | 5/2005 | Larson et al. |
| 6,989,685 B1 * | 1/2006 | Andersen et al. ............ 324/765 |
| 2003/0151958 A1 | 8/2003 | Marr et al. |
| 2004/0012397 A1 | 1/2004 | Mizuno et al. |
| 2005/0192773 A1 * | 9/2005 | Sheng et al. ................. 702/132 |

OTHER PUBLICATIONS

Oleg Semenov et al., "Burn-in Temperature Projections for Deep Sub-micron Technologies", 2003, IEEE, ITC International Test Conference, Paper 4.3, pp. 95-104.

* cited by examiner

METHOD AND APPARATUS FOR BURN-IN OPTIMIZATION

CROSS-REFERENCE TO RELATED APPLICATIONS

This application is a Divisional application of co-pending patent application Ser. No. 10/908,620, filed May 19, 2005, entitled "Method and Apparatus for Burn-In Optimization."

BACKGROUND OF THE INVENTION

1. Field of the Invention

The present invention generally relates to integrated circuits. More particularly, the present invention provides a method and apparatus for optimizing the burn-in of integrated circuits.

2. Related Art

Burn-in is a testing procedure that employs elevated voltage and temperature levels to accelerate the electrical failure of integrated circuits. Burn-in may be used as a reliability monitor and/or as a production screen to weed out potential mortalities from an integrated circuit lot.

During the burn-in of an integrated circuit, there is a limit on the overall power dissipation because of the ability to cool and supply power to the integrated circuit. Burn-in power dissipation is exponential with regard to voltage and temperature, so that dropping the voltage or temperature to meet power supply specifications and avoid thermal runaway greatly extends burn-in time. As future technologies continue to shrink, the ability to subject an integrated circuit to voltages above normal Vdd or temperatures above normal operating temperatures becomes more and more limited. As a result, burn-in times will need to become longer and longer, adding significant cost and cycle time to the burn-in process, to a point that may eventually be prohibitive using current burn-in methods.

SUMMARY OF THE INVENTION

The present invention provides a method and apparatus for optimizing the burn-in of integrated circuit chips. In particular, the present invention reduces power consumption during burn-in, while still allowing for elevated voltage and temperature stress levels, by taking advantage of changes that occur within an integrated circuit during burn-in. In accordance with an embodiment of the present invention, input conditions (e.g., one or more of clocking, input signals, data patterns, etc.) of an integrated circuit are controlled to drive changes in the integrated circuit that enhance optimization of the burn-in conditions.

A first aspect of the present invention is directed to a method for optimizing a burn-in process for an integrated circuit, comprising: performing a first portion of the burn-in process of the integrated circuit; monitoring a power dissipation of the integrated circuit during the first portion of the burn-in process; increasing a burn-in temperature until the power dissipation of the integrated circuit reaches a predetermined maximum power dissipation; and performing a subsequent portion of the burn-in process of the integrated circuit at the increased burn-in temperature.

A second aspect of the present invention is directed to a method for optimizing a burn-in process of an integrated circuit, comprising: performing a plurality of portions of the burn-in process at a predetermined maximum burn-in voltage; and adjusting a burn-in temperature and input conditions applied to the integrated circuit during different portions of the burn-in process of the integrated circuit, while maintaining a power dissipation of the integrated circuit below a predetermined maximum power dissipation.

A third aspect of the present invention is directed to a method for optimizing a burn-in process for an integrated circuit, comprising: monitoring a power dissipation of the integrated circuit during the burn-in process; selectively increasing a burn-in temperature of the burn-in process based on the power dissipation; and selectively applying different input conditions to the integrated circuit during the burn-in process to drive changes in the integrated circuit that enhance the burn-in process.

BRIEF DESCRIPTION OF THE DRAWINGS

These and other features of this invention will be more readily understood from the following detailed description of the various aspects of the invention taken in conjunction with the accompanying drawings in which.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

The present invention provides a method and apparatus for optimizing the burn-in of integrated circuit chips. Power consumption during burn-in is reduced, while still allowing for elevated voltage and temperature stress levels, by taking advantage of changes that occur within an integrated circuit during burn-in. Input conditions (e.g., one or more of clocking, input signals, data patterns, etc.) of an integrated circuit are controlled to drive changes in the integrated circuit that enhance optimization of the burn-in conditions. In the following discussion, an integrated circuit will generally be referred to as a "device."

Figure 1:
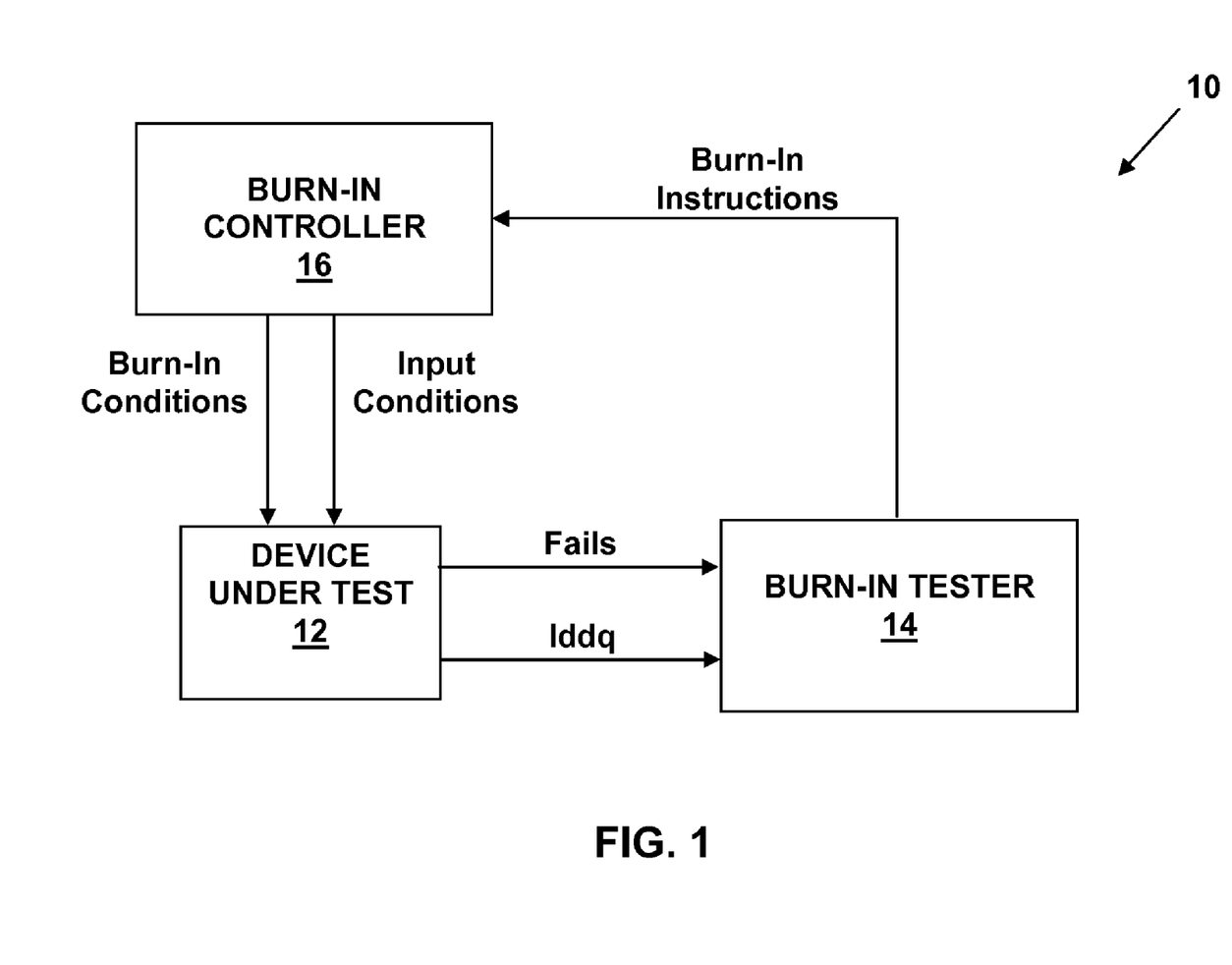
FIG. 1 depicts an illustrative burn-in apparatus in accordance with an embodiment of the present invention.

An illustrative burn-in apparatus 10 provided in accordance with an embodiment of the present invention is illustrated in FIG. 1. The burn-in apparatus 10 includes a device 12 under test, a burn-in tester 14, and a burn-in controller 16. The burn-in tester 14 detects defects (fails) in the device 12 during burn-in, monitors the quiescent supply current (Iddq) and power dissipation of the device 12, and performs other testing functions. The burn-in controller 16 controls the burn-in conditions (e.g., voltage, temperature) applied to the device 12 during burn-in. The burn-in controller 16 also controls the input conditions (e.g., clocking, input signals, data patterns) applied to the device 12 during burn-in. The burn-in controller 16 controls the burn-in and input conditions applied to the device 12 based on instructions from the burn-in tester 14.

Figure 2:
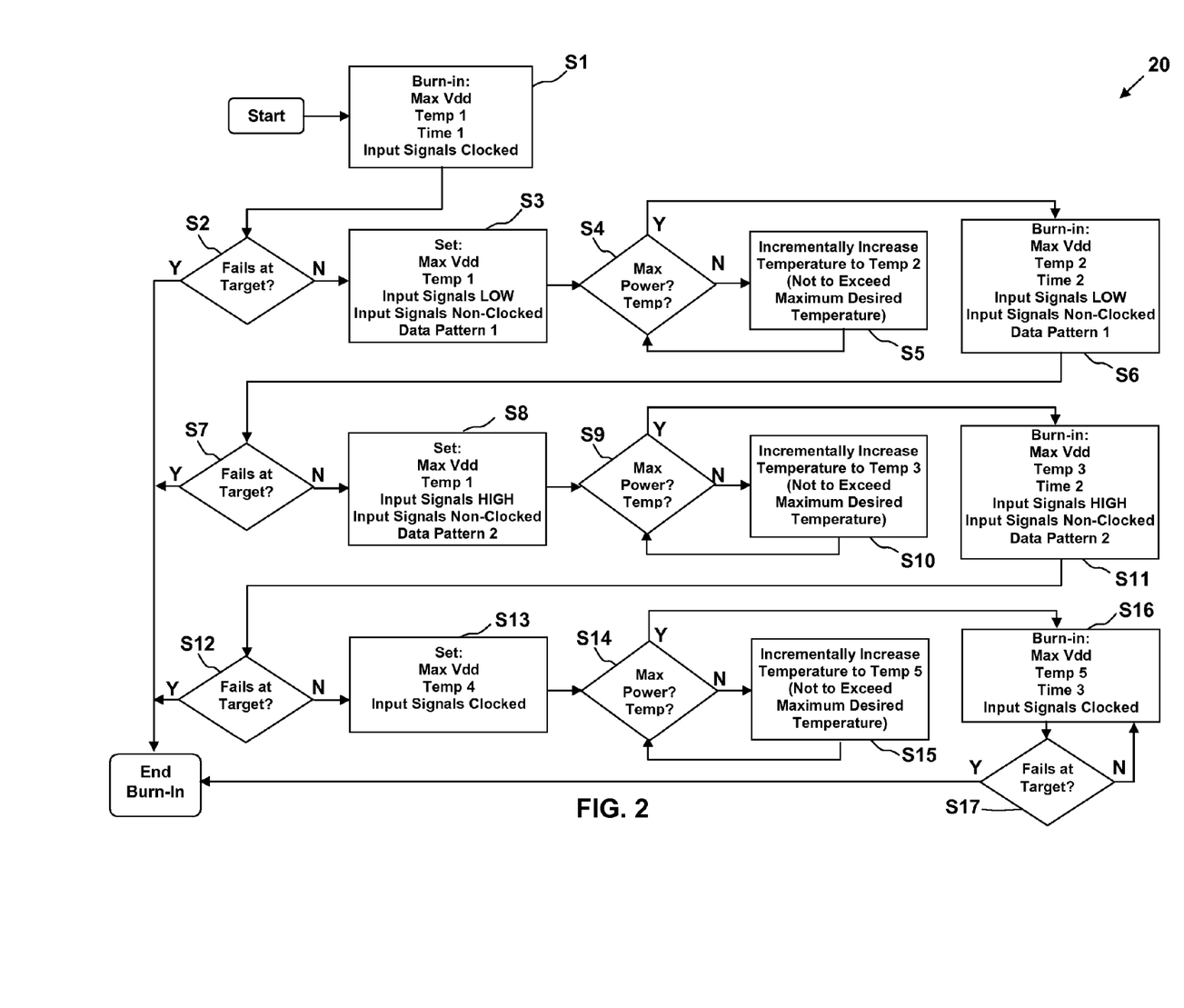
FIG. 2 depicts a flow diagram of a method in accordance with an embodiment of the present invention.

A flow diagram 20 of a method in accordance with an embodiment of the present invention is depicted in FIG. 2. Various steps in the flow diagram 20 will be described below in conjunction with the components of the burn-in apparatus 10 shown in FIG. 1. In this method, the burn-in temperature is adjusted in conjunction with the form/manner input signals are applied to the device 12 (e.g., either fixed in one state or clocked between states).

The burn-in provided by the burn-in apparatus 10 is performed in stages. During each stage, both the burn-in conditions and input conditions are optimized to perform a particular partial function of burn-in and to keep the power dissipation of the device 12 below a desired maximum value. Optimization is provided by applying the maximum desired burn-in voltage Vdd while adjusting the burn-in temperature and the input conditions applied to the device 12. The first stages of burn-in are designed to induce an increase in the magnitude of the threshold voltage Vt of the NFETs and PFETs in the device 12, which results in a decrease in device 12 current and a corresponding decrease in the total power dissipation of the device 12. This allows the burn-in temperature to be increased.

During burn-in, the characteristics of the NFETs and PFETs in the device 12 undergo changes according to different failure mechanisms. The failure mechanisms involved and the resulting effects can be summarized as follows:

(A) The injection of conducting hot carriers generated when the device is ON into the gate oxide of the NFETs and PFETs, and the injection of hot carriers generated as a result of current in device 12 into the gate oxide of the NFETs and PFETs. For NFETs, the maximum degradation occurs with Vgs=0.5×Vds, while for PFETs the maximum degradation is at Vds=Vgs. For NFETs, electrons are injected into the gate oxide, while for PFETs, holes are injected. For both NFETs and PFETs, the resulting effect is an increase in the magnitude of Vt and an associated reduction in the device 12 current.

(B) Non-conducting hot carriers where Vgs=0 and the device 12 is OFF. Because of high voltage and/or temperature burn-in conditions, there is a significant amount of sub-threshold leakage leading to injection of carriers into the gate oxide of NFETs and PFETs in the device 12. The resulting effect is again an increase in magnitude of Vt for NFETs and PFETs and a reduction in the device 12 current.

(C) Negative Bias Temperature Instability (NBTI) in PFETs. This occurs when a PFET is stressed at high temperature and a high voltage is applied to the PFET in the ON condition. The resulting effect is an increase in the magnitude of Vt for the PFET and hence a reduction in the PFET currents in the device 12.

In step S1 of the flow diagram 20 illustrated in FIG. 2, burn-in is performed on the device 12 at the maximum desired Vdd and at a temperature (Temp 1) for a predetermined period of time (Time 1). Temp 1, which may comprise, for example, room temperature, is below the temperature (e.g., 140° C.) typically used in burn-in processes of the prior art. During this first stage of the burn-in process, the input signals of device 12 are clocked. This maximizes the effect of conducting hot carriers on the NFETs and PFETs in the device 12 (i.e., reduction of Vt and associated reduction of device 12 current). Step S1 results in a partial burn-in of device 12 due to the high burn-in voltage as well as a decrease in power dissipation due to the reduction of current in the device 12.

In step S2, the number of fails in the device 12 is detected by the burn-in tester 14 and is compared to a target value of fails for the device 12. If the number of fails is lower than the target value, indicating that burn-in should continue, flow passes to step S3. Otherwise, the burn-in process ends. The specific number of target fails is device specific.

In step S3, the burn-in voltage remains at the at the maximum desired Vdd and the burn-in temperature is initially set at Temp 1 (e.g., room temperature). In addition, the input signals of device 12 are set to LOW and are non-clocked, and a data pattern (Data Pattern 1) comprising a pattern of "1" and "0" data is written into the device 12. Flow then passes to step S4.

In step S4, the power dissipation of the device 12 is determined (e.g., by the burn-in tester 14). If the power is at the predetermined maximum power level (device specific), then burn-in is performed in step S6. If the power is lower than the predetermined maximum power level, however, then the burn-in temperature is incrementally increased (e.g., by increments of 5° C.) in step S5 to a higher temperature (Temp 2), until the power is at the predetermined maximum power level or a maximum desired burn-in temperature has been reached. A second stage of the burn-in process is then performed on the device 12 in step S6. In this stage of the burn-in process, burn-in is performed at the maximum desired Vdd, at the temperature Temp 2 (Temp 2≧Temp 1), for a predetermined period of time (Time 2), with the input signals of the device 12 set to LOW and non-clocked, and with Data Pattern 1 written into the device 12. It should be noted that in this and other temperature-changing steps, the burn-in temperature can also be increased in a continuous fashion rather than in fixed increments.

In the second stage of the burn-in process the power dissipation in the device 12 is reduced due to several factors. A first factor is the increase in Vt of the NFETs and PFETs in the device 12 due to the hot carriers generated during the first stage of the burn-in process. A second factor is the absence of switching power, which provides a portion of the total power dissipation. A third factor is the increase in Vt in the PFETs in the device 12 due to the NBTI effect, which is accelerated by both voltage and temperature.

In step S7, the number of fails in the device 12 is again detected by the burn-in tester 14 and compared to the target value of fails for the device 12. If the number of fails is lower than the target value, indicating that burn-in should continue, flow passes to step S8. Otherwise, the burn-in process ends.

In step S8, the burn-in voltage remains at the at the maximum desired Vdd and the burn-in temperature is initially set at Temp 1 (e.g., room temperature). In addition, the input signals of device 12 are set to HIGH and are non-clocked, and a data pattern (Data Pattern 2) comprising a pattern of "1" and "0" data opposite to that written into the device 12 in step S3 is written into the device 12. Flow then passes to step S9.

In step S9, the power dissipation of the device 12 is determined. If the power is at the predetermined maximum power level, then burn-in is performed in step S11. If the power is lower than the predetermined maximum power level, however, then the burn-in temperature is incrementally increased (e.g., by increments of 5° C.) in step S10 to a higher temperature (Temp 3), until the power is at the predetermined maximum power level or a maximum desired burn-in temperature has been reached. A third stage of the burn-in process is then performed on the device 12 in step S11. In this stage of the burn-in process, burn-in is performed at the maximum desired Vdd, at the temperature Temp 3 (Temp 3≧Temp 1), for a predetermined period of time (Time 2), with the input signals of the device 12 set to High and non-clocked, and with Data Pattern 2 written into the device 12. The third stage of the burn-in process provides a further incremental reduction of power dissipation in the device 12. This further incremental reduction of power dissipation occurs because of the NBTI effect in the PFETs in the device 12 that were not stressed in the previous burn-in stage (i.e., step S6). Flow then passes to step S12.

In step S12, the number of fails in the device 12 is again detected by the burn-in tester 14 and compared to the target value of fails for the device 12. If the number of fails is lower than the target value, indicating that burn-in should continue, flow passes to step S13. Otherwise, the burn-in process ends.

In step S13, the burn-in voltage remains at the at the maximum desired Vdd and the burn-in temperature is initially set at a temperature Temp 4 (Temp 4>Temp 1). In addition, the input signals of device 12 are clocked as under normal device 12 operation. Flow then passes to step S14.

In step S14, the power dissipation of the device 12 is determined. If the power is at the predetermined maximum power level, then burn-in is performed in step S16. If the power is lower than the predetermined maximum power level, however, then the burn-in temperature is incrementally increased (e.g., by increments of 5° C.) in step S15 to a higher temperature (Temp 5), until the power is at the predetermined maximum power level or a maximum desired burn-in temperature has been reached. A final stage of the burn-in process is then performed on the device 12 in step S16. In this stage of the burn-in process, burn-in is performed at the maximum desired Vdd, at a temperature Temp 5 (Temp 5≧Temp 4), for a predetermined period of time (Time 3), and with the input signals of the device 12 clocked. Step S16 is repeated as necessary (step S17) until the number of fails in the device 12 reaches the target value of fails, at which time the burn-in process is completed.

Under the accelerated voltage/temperature conditions of burn-in, device associated leakages, currents, and power dissipation will decrease as function of time during the burn-in process. The present invention takes advantage of this fact to optimize the burn-in process and provide devices 12 that have reached a "hardened" state, where most of the degradation that the devices will ever experience during their lifetime has already occurred.

The burn-in process described above can be performed on the device 12 in a dynamic fashion instead of using a multi-step procedure. This can be accomplished, for example, by continuously monitoring Iddq (e.g., using the burn-in tester 14), which is a key indicator of power dissipation. As the burn-in progresses, the power and thus Iddq will decrease due to the increase in Vt of the NFETs and PFETs experiencing hot carriers and NBTI degradation. When the level of Iddq during burn-in reaches certain pre-set limit(s), a dynamic control can be executed to change burn-in conditions (e.g., temperature, input current, etc.) as well as the form of the input signals, either switching or not switching. Thus, as Iddq (and power dissipation) decreases during burn-in, due to device degradation, the burn-in temperature and/or input current can be increased to enhance burn-in efficiency and reduce the total time required to perform the burn-in function. For example, in the process depicted in the flow diagram 20 of FIG. 2, the value of Iddq can be used to dynamically trigger a change in the burn-in conditions (e.g., steps S4, S9, and S14, FIG. 2) and/or the form of the input signals (e.g., steps S3, S8, and S13, FIG. 2).

Figure 3:
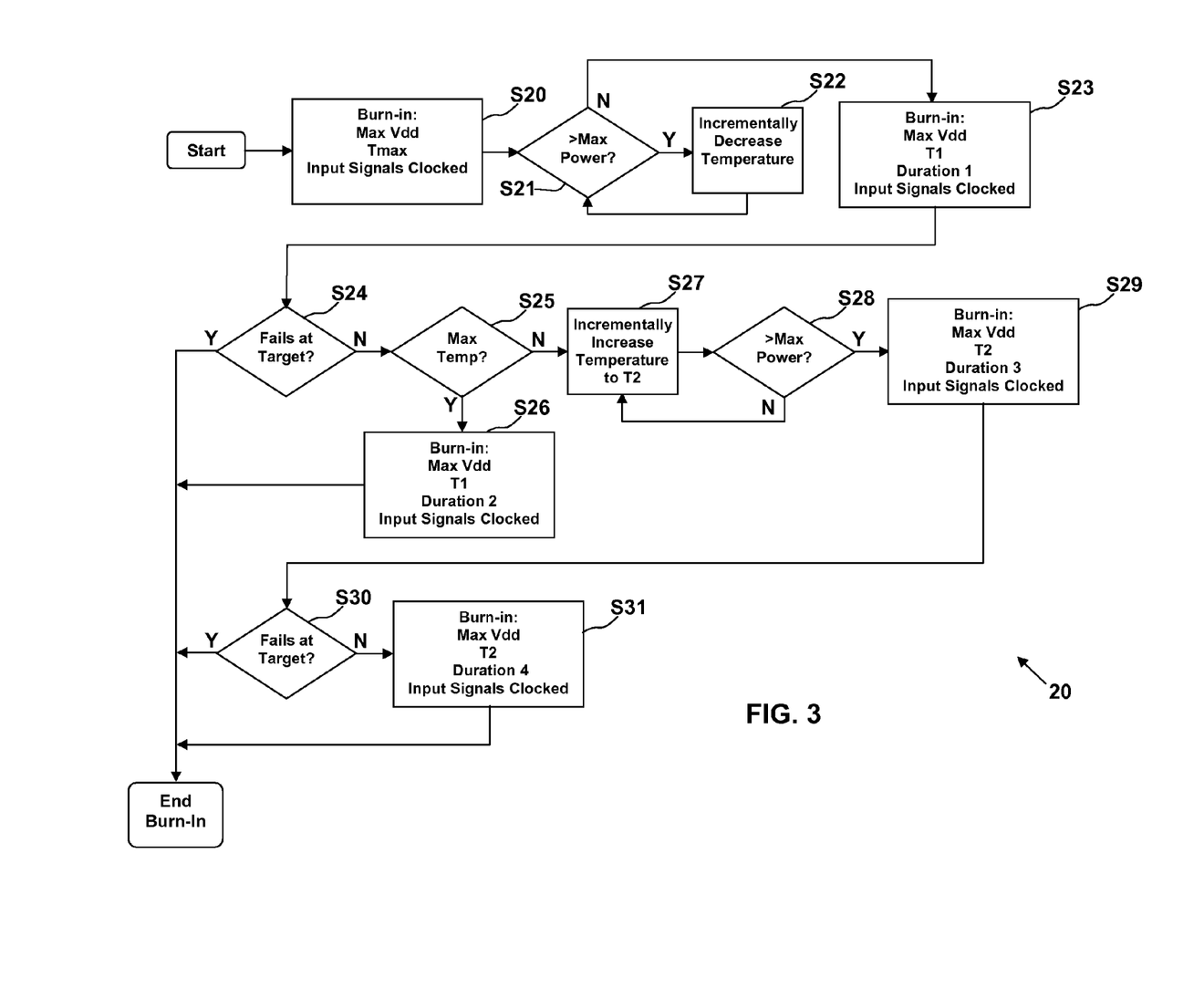
FIG. 3 depicts a flow diagram of a method in accordance with another embodiment of the present invention.

A flow diagram 30 of a method in accordance with another embodiment of the present invention is illustrated in FIG. 3. Various steps in the flow diagram 30 will be described below in conjunction with the components of the burn-in apparatus 10 shown in FIG. 1.

In this embodiment of the present invention, the first stage of burn-in run at room temperature (i.e., step S1, FIG. 2) is eliminated for cases where the burn-in degradation at room temperature is not significantly higher than degradation at higher temperatures (e.g., up to 140° C.). Thus, for such cases, there is no advantage in running a burn-in step at room temperature. Also, for cases where the device switching power at burn-in voltages and temperatures is not significant, then the above-described stages of burn-in, where signals and addresses are applied without clocking the device 12 (i.e., steps S3 and S8, FIG. 2), can also be eliminated. Instead, the device 12 can be operated with input signals fully clocked, as in normal operation. The first burn-in stage is run at the maximum desired Vdd and at a burn-in temperature such that the maximum desired power dissipation in the device 12 is not exceeded. At this burn-in temperature, the hot carriers and NBTI mechanisms are induced in the NFETs and PFETs of the device 12 as discussed above.

In step S20 of the flow diagram 30, burn-in is performed on the device 12 at the maximum desired Vdd and at the maximum desired temperature Tmax (e.g., 140° C.). During this first stage of the burn-in process, the input signals of device 12 are clocked. If, in step S21, it is determined that the power dissipation of the device 12 during burn-in is greater than the predetermined maximum power level, then the burn-in temperature is decreased (e.g., by 50°) to a lower temperature T1 in step S22. Otherwise, flow passes to step S23. Steps S21 and S22 are repeated as necessary until the power dissipation of the device 12 does not exceed the predetermined maximum power level. In step S23, burn-in is performed on the device 12 at the maximum desired Vdd, at the temperature T1 (T1≦Tmax), for a predetermined period of time (Duration 1), with the input signals of the device 12 clocked.

In step S24, the number of fails in the device 12 is detected by the burn-in tester 14 and compared to the target value of fails for the device 12. If the number of fails is lower than the target value, indicating that burn-in should continue, flow passes to step S25. Otherwise, the burn-in process ends.

If the burn-in temperature T1 is determined in step S25 to be at the maximum allowed burn-in temperature, then burn-in is performed in step S26 for an additional time (Duration 2) at the maximum desired Vdd, at the temperature T1, and with the input signals of the device 12 clocked. After this additional burn-in, the burn-in process ends. If the burn-in temperature T1 is determined in step S25 to be below the maximum allowed burn-in temperature, however, then the burn-in temperature is incrementally increased (e.g., by increments of 5° C.) in step S27 to a higher temperature T2 (T2>T1), until the power dissipated by the device 12 reaches the predetermined maximum power level (step S28). Burn-in is then performed in step S29 at the maximum desired Vdd, at the temperature T2, for a predetermined period of time (Duration 3), and with the input signals of the device 12 clocked.

In step S30, the number of fails in the device 12 is detected by the burn-in tester 14 and compared to the target value of fails for the device 12. If the number of fails is lower than the target value, indicating that burn-in should continue, flow passes to step S31. Otherwise, the burn-in process ends. In step S31, burn-in is performed for an additional time (Duration 4) at the maximum desired Vdd, at the temperature T2, and with the input signals of the device 12 clocked. After this additional burn-in, the burn-in process ends.

In the embodiment of the present invention described with regard to the flow diagram 20 of FIG. 2, the first stages of burn-in are designed to induce an increase in the magnitude of Vt by device degradation, which results in a decrease in the power dissipation of the device 12. This allows the burn-in temperature during subsequent stages of burn-in to be increased. The increase in the magnitude of Vt occurs due to the mechanisms of hot carriers in NFETs and PFETs, and the NBTI mechanism in PFETs. As is typically the case for scaled CMOS technologies, the NBTI mechanism causes the largest amount of degradation under normal operating conditions as well as under burn-in. In the following discussion, the effect and optimization of the NBTI mechanism will be quantified and demonstrated.

The example discussed below is for a CMOS technology with a gate oxide thickness of 1.4 nm and a PFET channel length ($L_D$) of 0.08 μm and channel width ($W_D$) of 0.1 μm. The nominal operating use voltage of the technology is 1.2 V, and the operating temperature varies up to 125° C. The nominal increase in magnitude of threshold voltage Vt can be expressed as:

$$\Delta Vt = (500 \times FC)/(500 + FC) \quad \text{Equation (1)}$$

$$FC = 205 \exp(-0.141/kT_J)(|V_g|/T_{ox})^{2.543}$$

$$[1+(0.026/W_D)] [1+(0.026/LD)] t^{0.176} \quad \text{Equation (2)}$$

where $\Delta Vt$ is in mV, $T_J$ is the junction temperature in degrees Kelvin, k is Boltzmann's constant, $T_{ox}$ is the oxide thickness in nm, and t is the stress time in seconds.

Figure 4:
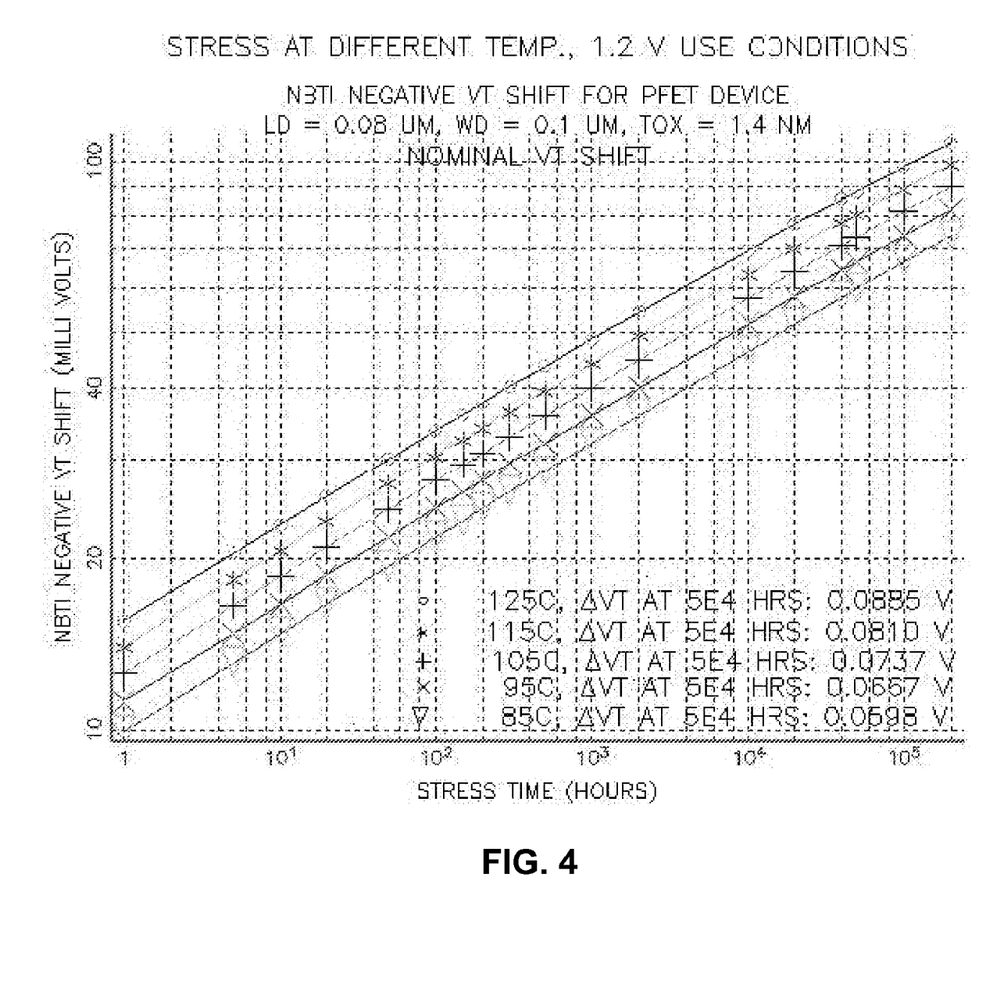
FIG. 4 depicts the shift in magnitude of threshold voltage versus stress time for an illustrative device under normal use conditions.

FIG. 4 depicts the shift in magnitude of Vt versus stress time for operation at 1.2 V and various operating temperatures ranging from 85° C. to 125° C. For a lifetime of 100,000 hours and an NBTI effective stress duty factor of 0.5, the effective stress time for the NBTI mechanism during use conditions is 50,000 hours. The nominal $\Delta Vt$ at use conditions is summarized in Table 1.

TABLE 1

| | Use Temperature, ° C. | | | | |
|---|---|---|---|---|---|
| | 125 | 115 | 105 | 95 | 85 |
| ΔVt, mV | 88.5 | 81.0 | 73.7 | 66.7 | 59.8 |

Figure 5:
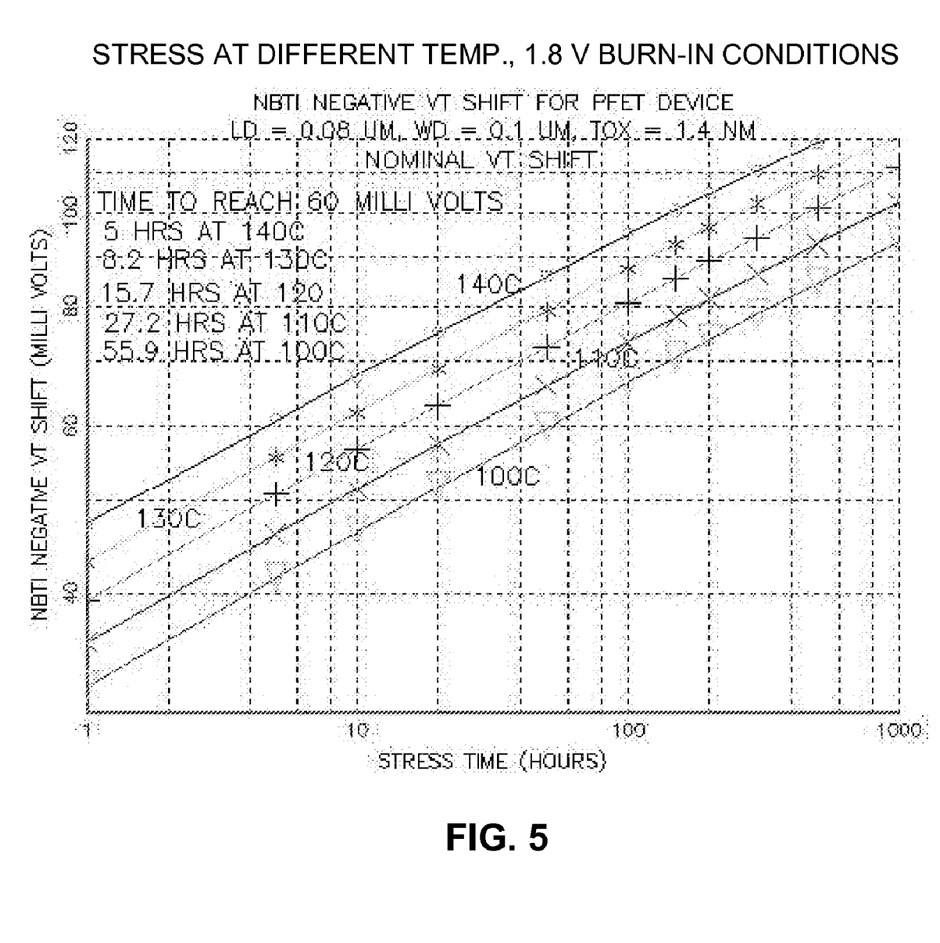
FIGS. 5 depicts the nominal increase in the magnitude of threshold voltage versus stress time for an illustrative device under burn-in conditions.

For burn-in, the desired maximum burn-in temperature in this example is 140° C. and the desired maximum voltage is 1.8 V (1.5×nominal supply voltage). FIG. 5 depicts the nominal increase in the magnitude of Vt versus stress time under a burn-in voltage of 1.8 V, at different burn-in temperatures varying from 100° C. to 140° C. From FIG. 5, the ΔVt after 5 hours of burn-in at 140° C. and 1.8 V is about 60 mV. This amount of ΔVt of 60 mV is set as a target of burn-in based on prior experience of having 5 hours of burn-in at the above conditions. Table 2 shows the burn in stress time required to reach 60 mV at different burn-in temperatures at 1.8 V.

TABLE 2

| | Burn-In Temperature, ° C. | | | | |
|---|---|---|---|---|---|
| | 140 | 130 | 120 | 110 | 100 |
| Hours To Reach ΔVt of 60 mV | 5 | 8.2 | 15.7 | 27.2 | 55.9 |

Figure 6:
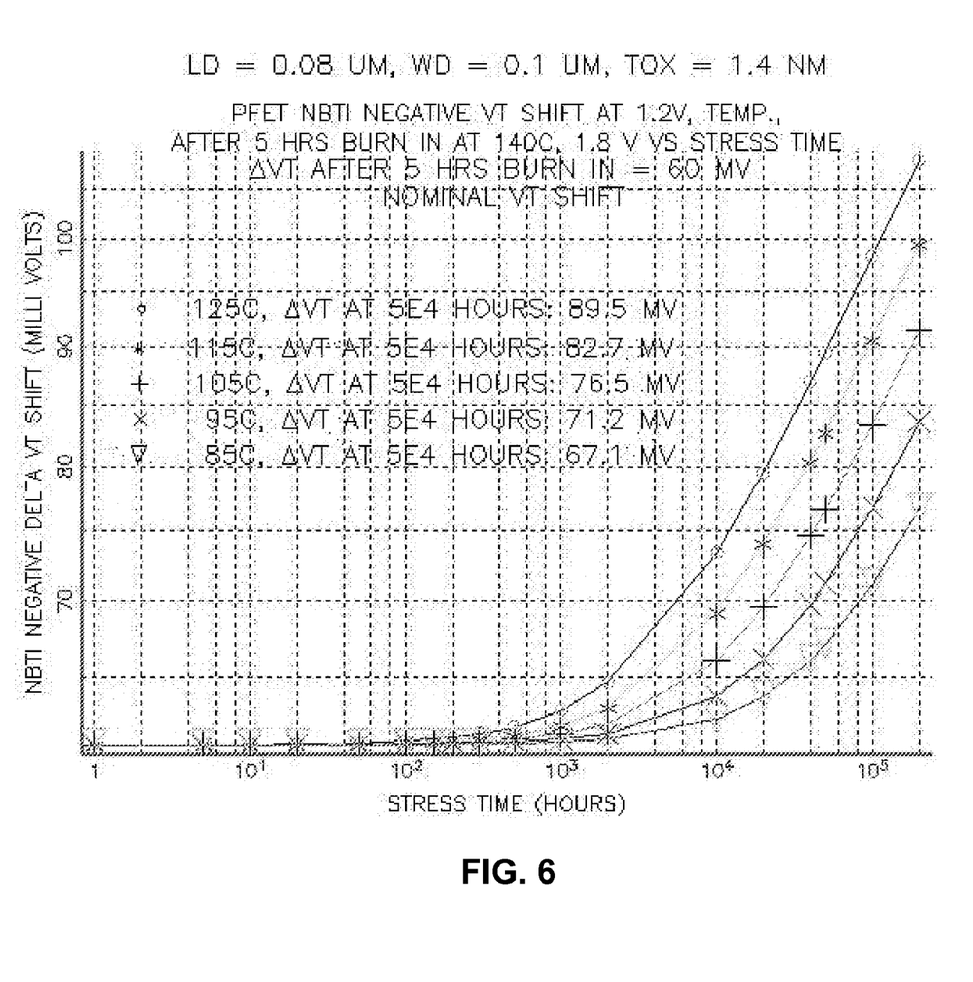
FIG. 6 depicts the total increase in the magnitude of threshold voltage shift versus total effective stress time for an illustrative device after burn-in and the application of use conditions.

In accordance with the flow diagram 20 of FIG. 2, burn-in temperatures less than 140° C. would be required in the early stages of burn-in when the power dissipation at 140° C. and 1.8 V is higher than the maximum allowed. FIG. 6 depicts, for the application of burn-in with a target ΔVt of 60 mV, the total increase in the magnitude of the Vt shift following burn-in and the application of use conditions at a voltage of 1.2 V versus the total effective stress time for NBTI, for various operating use temperatures from 125° C. to 85° C. The total increase in the magnitude of Vt following burn-in (ΔVt of 60 mV) and operating at use conditions following burn-in can be found from FIG. 6, and is shown in Table 3.

TABLE 3

| | Use Temperature, ° C. | | | | |
|---|---|---|---|---|---|
| | 125 | 115 | 105 | 95 | 85 |
| Total ΔVt Due to Burn-In and Use Conditions, mV | 89.5 | 82.7 | 76.5 | 71.2 | 67.1 |

Figure 7:
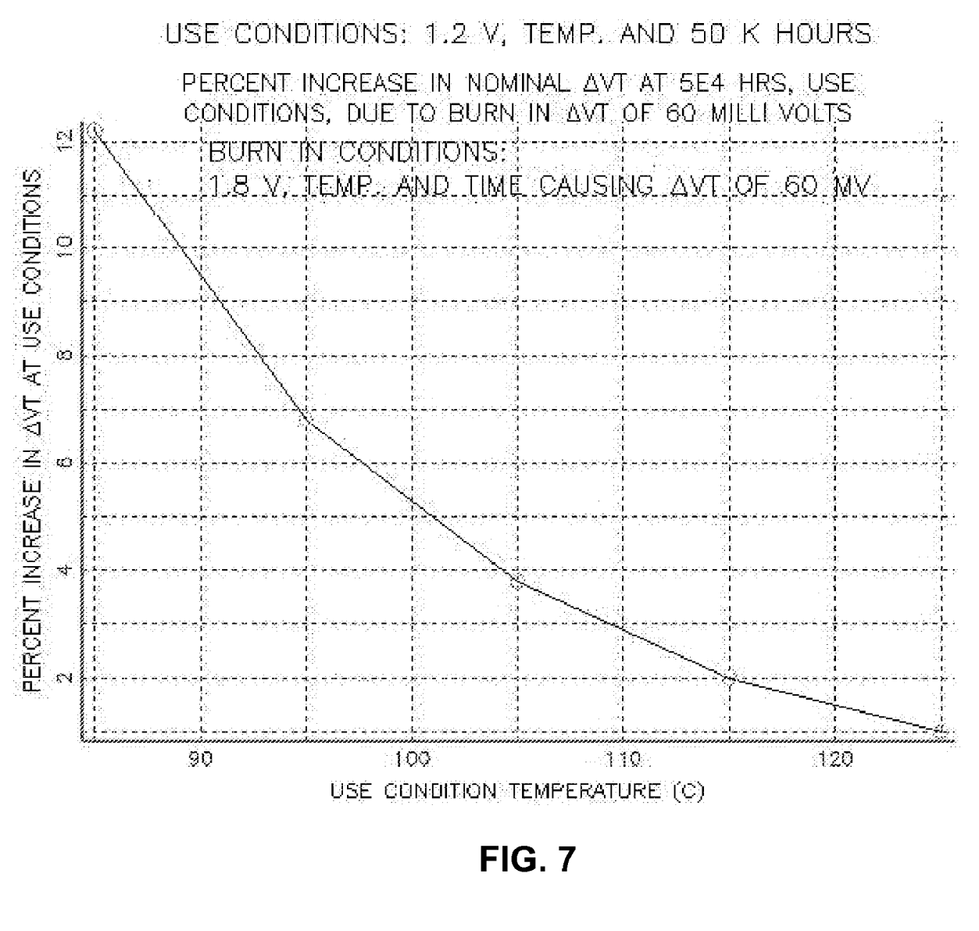
FIG. 7 depicts the percent increase in the magnitude of threshold voltage shift from burn-in due to use conditions.

From the results of FIGS. 5 and 6, one can determine the percent (%) increase in the magnitude of ΔVt from burn-in due to use conditions at 1.2V, 50,000 hours, and at different temperatures. The results are shown in FIG. 7 and the values are provided in Table 4.

TABLE 4

| | Use Temperature, ° C. | | | | |
|---|---|---|---|---|---|
| | 125 | 115 | 105 | 95 | 85 |
| % Increase in ΔVt From Burn-In Due to Use Conditions | 1 | 2 | 3.8 | 6.8 | 12.2 |

The results shown in Table 4 demonstrate that the burn-in is optimized at burn-in temperatures lower than the desired maximum temperature, as provided by the present invention. To this extent, the majority (about 10% or less) of the NBTI device degradation that the device will experience will occur under burn-in, and only a small increase (about 10%) in the ΔVt will occur under normal operating conditions to End-Of-Life, following burn-in. In the above example for PFET NBTI, the increase in magnitude in Vt is about 60 mV. Assuming that the device power dissipation is approximately equally divided between NFETs and PFETs, and based on the above example, this would correspond to about a 41% reduction in device power dissipation due to the increase of 60 mV in the magnitude of Vt of the PFETs. Also, if it is assumed that the increase in Vt of the NFETs due to hot carriers in the early stages of burn-in is about 20 mV, then the total reduction in device power dissipation due to the combined effects of the increase in Vt in NFETs and PFETs due to hot carriers and NBTI, respectively, is about 64.4%, which is significant.

It should be noted that if the burn-in temperature in the early stages of burn-in (to induce NBTI in PFETs) is less than the desired maximum (140° C.), then in the final stages of burn-in when the temperature is raised to or close to the desired maximum temperature, there would be some additional NBTI degradation for PFETs. This should be taken into account in the design of the burn-in for each specific case in question. For example, if the burn-in temperature in the early stages is reduced to 130° C., then from Table 2, 8.2 hours would be required at 130° C. to induce an increase of 60 mV in the magnitude of Vt of the PFETs due to the NBTI mechanism. When the temperature is raised to 140° C. in the final stages of burn-in, the burn-in at this temperature would be conducted for about 3 hours to obtain an effective total burn-in time of 5 hours at 140° C. The additional 3 hours of burn in at 140° C. would make the total ΔVt due to both the 130° C. and 140° C. portions of burn-in approximately 61.6 mV. This is only a 2.5% increase in ΔVt over the 60 mV shift which occurs for a burn-in of 5 hours at 140° C., without the early part of burn-in at 130° C. for 8.2 hours.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A method for optimizing a burn-in process of an integrated circuit, comprising:
    performing a plurality of different portions of the burn-in process at a predetermined maximum burn-in voltage;
    selecting specific input conditions for each of the plurality of different portions of the burn-in process to drive changes in the integrated circuit that enhance the burn-in process, wherein the changes include an increase in a threshold voltage of NFETs and PFETs in the integrated circuit and a corresponding decrease in a power dissipation of the integrated circuit; and
    adjusting a burn-in temperature and the input conditions applied to the integrated circuit during the plurality of different portions of the burn-in process of the integrated circuit, while maintaining the power dissipation of the integrated circuit below a predetermined maximum power dissipation;
    wherein adjusting a burn-in temperature and the input conditions comprises:
        performing an initial burn-in of the integrated circuit at an initial burn-in temperature and a set of input conditions, wherein the initial burn-in temperature is approximately within the range of 18 to 28 degrees Celsius;
        determining if the power dissipation of the integrated circuit is below the predetermined maximum power dissipation; and
        in the case that the power dissipation of the integrated circuit is below the predetermined maximum power dissipation, incrementally increasing the burn-in temperature from the initial burn-in temperature until the predetermined maximum power dissipation is reached to optimize the burn-in process.

2. The method of claim 1, wherein the input conditions are selected from the group comprising:
    clocking of input signals to the integrated circuit;
    non-clocking of the input signals to the integrated circuit;
    setting the input signals to the integrated circuit to a first logic level; and
    setting the input signals to the integrated circuit to a second logic level.

* * * * *